United States Patent
Zeidman

(10) Patent No.: US 7,266,490 B2
(45) Date of Patent: Sep. 4, 2007

(54) APPARATUS AND METHOD FOR CONNECTING HARDWARE TO A CIRCUIT SIMULATION

(76) Inventor: Robert Marc Zeidman, 7599 Squirewood Way, Cupertino, CA (US) 95014

( * ) Notice: Subject to any disclaimer, the term of this patent is extended or adjusted under 35 U.S.C. 154(b) by 828 days.

(21) Appl. No.: 10/158,648

(22) Filed: May 31, 2002

(65) Prior Publication Data

US 2003/0225556 A1 Dec. 4, 2003
US 2007/0061122 A9 Mar. 15, 2007

Related U.S. Application Data

(63) Continuation-in-part of application No. 09/751,573, filed on Dec. 28, 2000, now Pat. No. 7,050,962.

(51) Int. Cl.
*G06F 9/455* (2006.01)

(52) U.S. Cl. .............. 703/27; 703/22; 703/13; 703/17; 703/21; 709/228; 709/230; 709/219; 714/33; 714/726; 370/241; 710/305

(58) Field of Classification Search ............... 703/15, 703/14, 21, 13; 706/25; 716/16; 714/4, 714/33; 719/316; 709/223; 375/147; 713/190; 702/91, 123
See application file for complete search history.

(56) References Cited

U.S. PATENT DOCUMENTS

| | | | |
|---|---|---|---|
| 4,590,581 A | | 5/1986 | Widdoes, Jr. |
| 4,635,218 A | | 1/1987 | Widdoes, Jr. |
| 4,744,084 A | | 5/1988 | Beck |
| 5,299,313 A | * | 3/1994 | Petersen et al. ............ 709/234 |
| 5,303,347 A | * | 4/1994 | Gagne et al. ............... 711/119 |
| 5,307,459 A | * | 4/1994 | Petersen et al. ............ 709/250 |
| 5,479,355 A | | 12/1995 | Hyduke |
| 5,740,448 A | * | 4/1998 | Gentry et al. ............... 710/200 |
| 5,748,806 A | * | 5/1998 | Gates ......................... 710/315 |
| 5,748,875 A | | 5/1998 | Tzori |
| 5,761,486 A | * | 6/1998 | Watanabe et al. ............. 703/21 |
| 5,822,520 A | * | 10/1998 | Parker ........................ 709/230 |
| 5,838,950 A | * | 11/1998 | Young et al. ................. 703/21 |
| 5,848,236 A | * | 12/1998 | Dearth et al. ................ 714/33 |
| 5,850,345 A | * | 12/1998 | Son ............................. 703/17 |

(Continued)

OTHER PUBLICATIONS

Wesley W. Chu and M. Y. Elsanadidi☐☐Simulation Studies of the Behavior of Multihop Broadcast☐☐ACM, 0-89791-089-3/83/0300-0170, 1983, pp. 170-177.*

(Continued)

*Primary Examiner*—Fred Ferris
*Assistant Examiner*—Cuong Van Luu
(74) *Attorney, Agent, or Firm*—Edward C. Kwok; MacPherson Kwok Chen & Heid LLP

(57) ABSTRACT

A system and method is described for connecting a logic circuit simulation to a hardware peripheral that includes a computer running software for communicating data to and from the hardware peripheral. The software transmits the data received from the hardware peripheral to the device being simulated by the logic circuit simulation. The computer also transmits the data received from the device being simulated by the electronic circuit simulation to the hardware peripheral. This allows the user to test the device being simulated using real hardware for input and output instead of simulated hardware.

60 Claims, 4 Drawing Sheets

U.S. PATENT DOCUMENTS

| | | | |
|---|---|---|---|
| 5,881,269 A * | 3/1999 | Dobbelstein | 703/21 |
| 5,889,954 A * | 3/1999 | Gessel et al. | 709/223 |
| 5,907,696 A * | 5/1999 | Stilwell et al. | 703/13 |
| 5,963,726 A * | 10/1999 | Rust et al. | 703/13 |
| 6,047,387 A * | 4/2000 | Chang et al. | 714/33 |
| 6,108,309 A * | 8/2000 | Cohoe et al. | 370/241 |
| 6,141,689 A * | 10/2000 | Yasrebi | 709/228 |
| 6,151,567 A * | 11/2000 | Ames et al. | 703/13 |
| 6,202,044 B1 | 3/2001 | Tzori | |
| 6,230,114 B1 * | 5/2001 | Hellestrand et al. | 703/13 |
| 6,243,833 B1 * | 6/2001 | Hitchcock et al. | 714/33 |
| 6,263,302 B1 * | 7/2001 | Hellestrand et al. | 703/17 |
| 6,279,122 B1 * | 8/2001 | Hitchcock et al. | 714/33 |
| 6,307,877 B1 * | 10/2001 | Philips et al. | 375/130 |
| 6,324,492 B1 * | 11/2001 | Rowe | 703/13 |
| 6,345,242 B1 * | 2/2002 | Dearth et al. | 703/22 |
| 6,347,388 B1 * | 2/2002 | Hollander | 714/739 |
| 6,389,379 B1 * | 5/2002 | Lin et al. | 703/14 |
| 6,405,145 B1 * | 6/2002 | Rust et al. | 702/91 |
| 6,418,392 B1 * | 7/2002 | Rust et al. | 702/123 |
| 6,560,641 B1 * | 5/2003 | Powderly et al. | 709/219 |
| 6,584,436 B2 * | 6/2003 | Hellestrand et al. | 703/13 |
| 6,597,727 B2 * | 7/2003 | Philips et al. | 375/147 |
| 6,757,367 B1 * | 6/2004 | Nicol | 379/90.01 |
| 6,772,107 B1 * | 8/2004 | La Cascia et al. | 703/21 |
| 6,850,577 B2 * | 2/2005 | Li | 375/326 |
| 6,862,635 B1 * | 3/2005 | Alverson et al. | 710/52 |
| 6,898,233 B2 * | 5/2005 | Philips et al. | 375/130 |
| 6,904,110 B2 * | 6/2005 | Trans et al. | 375/350 |
| 2002/0067757 A1 * | 6/2002 | Philips et al. | 375/130 |
| 2002/0101824 A1 * | 8/2002 | Ziedman | 370/241 |
| 2004/0143655 A1 * | 7/2004 | Narad et al. | 709/223 |
| 2004/0148610 A1 * | 7/2004 | Tsun et al. | 719/316 |

OTHER PUBLICATIONS

Larkshman□□the Performance of TCP/IP for the Network with High Bandwidth-Delay Products and Random Loss□□IEEE/ACM Transaction on Networking, vol. 5, No. 3, Jun. 1997, pp. 336-350.*

* cited by examiner

APPARATUS AND METHOD FOR CONNECTING HARDWARE TO A CIRCUIT SIMULATION

CROSS-REFERENCE TO RELATED APPLICATION

The present application is a continuation-in-part application of copending U.S. patent application, Ser. No. 09/751,573, entitled "Method for Connecting a Hardware Emulator to a Network", filed on Dec. 28, 2000, now U.S. Patent 7,050,962, issued on May 23, 2006.

BACKGROUND OF THE INVENTION

Prior to reducing an integrated circuit design to a form suitable for fabrication, the integrated circuit design is often simulated in software on a computer to allow the design to be optimized and debugged. Typically, using a hardware description language (e.g., Verilog), the circuit designer prepares a description of the integrated circuit, which is then compiled into a software model to be simulated on the computer (e.g., an engineering workstation).

When an integrated circuit that connects to peripheral hardware, such as an LCD display or a Universal Serial Bus (USB) port, is simulated, the peripheral hardware is modeled in the hardware description language and communication with the peripheral hardware is also simulated. However, such a model of the peripheral hardware does not behave completely accurately and correctly. There are often logical, electrical, or timing differences between the simulation model and the physical peripheral hardware. When the integrated circuit is manufactured and connected to the actual peripheral hardware, these problems will become apparent and the integrated circuit will often need to be redesigned to compensate for them.

SUMMARY OF THE INVENTION

The present invention allows a logic circuit simulator running on a host computer (e.g., a personal computer) and simulating a circuit ("simulated device") to connect to a physical peripheral hardware device. The present invention provides a method and an apparatus for transferring data between a circuit simulation and the peripheral hardware device. In one embodiment, an interface software program also installed on said host computer is provided to handle communication between the operating system drivers for the peripheral hardware device and the simulated device. The peripheral hardware device can be, for example, a computer display monitor.

According to the present invention, data sent to a simulated device from a physical peripheral hardware device is received by the interface software and stored in buffers in the existing memory in the host computer. Said interface software in said host computer repackages the data into a second format for transmission to said simulated device. In one embodiment, the data from said physical peripheral hardware device is sent to the operating system of said host computer. Said interface software intercepts said data and examines it. If said data is intended for said simulated device, said interface software loads it into said data buffers, subsequently repackages said data into a second format for transmission to said simulated device and sends said repackaged data to the simulated device. If said data from said physical peripheral hardware device is not intended for said simulated device, said interface software program sends said data on to said host computer operating system.

Similarly, the interface software in the host computer repackages data received from the simulated device into proper format for transmission to the physical peripheral hardware device. Under this arrangement, the existing memory in the host computer is used to buffer data communicated between said simulated device and said physical peripheral hardware device. In one embodiment, the data from said simulated device is sent to the interface software program. If said data is intended for said physical peripheral hardware device, said interface software program repackages said data and sends said data to said host computer operating system for transmission to said physical peripheral hardware device. Said operating system is notified that said data is intended for said physical peripheral hardware device because said interface software program uses a specific application program interface (API) of the operating system used specifically to access said physical peripheral hardware device.

In one embodiment, the interface software of the host computer is implemented as a multithread program including four executing threads. One thread is a task that receives data from the physical peripheral hardware device and stores said received data in a first buffer. A second thread is a task that polls said first buffer for said received data. This second thread repackages said received data and sends said repackaged data via the simulation interface to the simulated device. A third thread is a task that receives data from said simulated device via said simulation interface and stores said received data in a second buffer. A fourth thread is a task that polls said second buffer for said data received from said simulated device. Said fourth thread repackages said data received from said simulated device and sends said repackaged data to said physical peripheral hardware device using an API of the operating system software of said host computer.

In another embodiment, the interface software of the host computer is implemented as a multithread program, as in the previous embodiment, except that the second buffer is eliminated and the third and fourth threads are combined into a single thread. In this embodiment, the tasks of the single thread receive data from the simulated device via the simulation interface, repackages said received data and sends said repackaged to said physical peripheral hardware device using an API of the operating system software of said host computer. This approach is possible because a circuit simulation runs at a much slower speed than the physical peripheral hardware device, such that data received from the simulated device can be repackaged and sent to the physical peripheral hardware device before the next data packet's arrival from the circuit simulation.

In yet another embodiment, the interface software of the host computer is implemented as a multithreaded program having, in one instance, two executing threads. One thread is a task that receives data from the physical peripheral hardware device, stores said received data in a buffer, retrieves said stored data for repackaging, and sends said repackaged data via a simulation interface to the simulated device. Another thread is a task that receives data from said simulated device via said simulation interface from said simulated device, repackages said data and sends said repackaged data to said physical peripheral hardware device using an API of the operating system software of said host computer.

Further features and advantages of various embodiments of the invention are described in the detailed description below, which is given by way of example only.

BRIEF DESCRIPTION OF THE DRAWINGS

The present invention will be understood more fully from the detailed description given below and from the accompanying drawings of the preferred embodiment of the invention, which, however, should not be taken to limit the invention to the specific embodiment but are for explanation and understanding only.

In the following detailed description, to simplify the description, like elements are provided like reference numerals.

DETAILED DESCRIPTION

Software that allows a logic circuit simulator running on a host computer (e.g., a personal computer) and simulating a circuit ("simulated device") to connect to a physical peripheral hardware device is described. In the following description, numerous specific details are set forth, such as the peripheral interface, the operating system, the type of computer, etc., in order to provide a thorough understanding of the present invention. It will be obvious, however, to one skilled in the art that these specific details need not be used to practice the present invention. In other instances, well known structures, functions, and software programs have not been shown in detail in order not to unnecessarily obscure the present invention.

Figure 1:
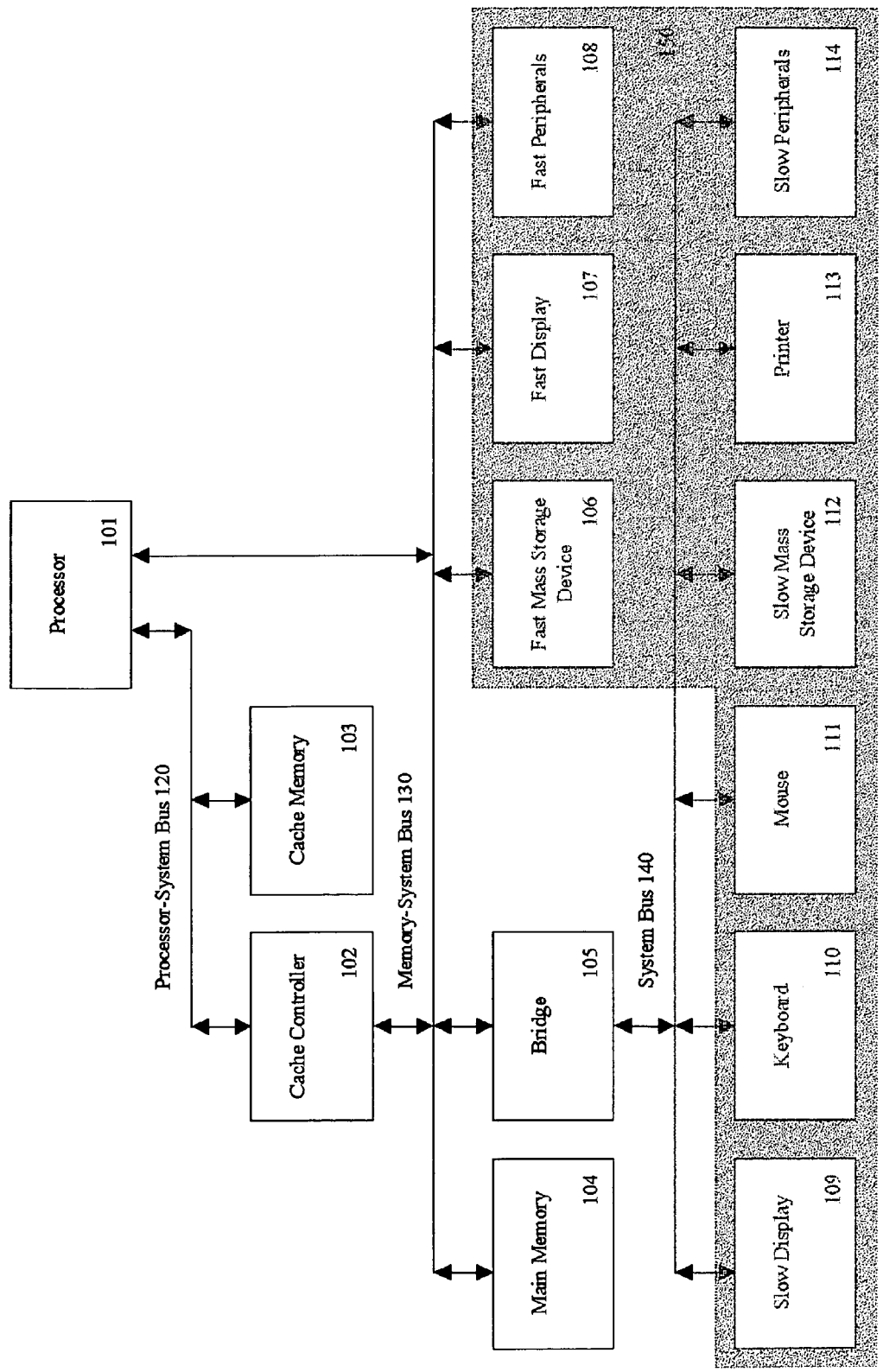
FIG. 1 shows a computer with various hardware peripherals including built-in peripherals and external peripherals.

FIG. 1 shows a typical computer configuration that implements the present invention. The processor 101 connects via high-speed processor-system bus 120 to the cache controller 102 and the cache memory 103. Said cache controller 102 connects via a medium speed memory-system bus 130 to main memory 104 and bridge 105 as well as to high speed peripheral devices such as fast mass storage device 106, fast display 107, and other fast peripherals 108. Note that said processor 101 also connects directly via medium speed memory-system bus 130 to said high speed peripherals fast mass storage device 106, fast display 107, and other fast peripherals 108. Said bridge 105 acts to connect the medium speed memory-system bus 130 to low-speed system bus 140 which connects to slow peripherals slow display 109, keyboard 110, mouse 111, slow mass storage device 112, printer 113, and slow peripherals 114. All peripherals, fast or slow, are shown in shaded box 150. Note that peripherals may in fact be boards or chips that drive peripheral devices, but for the purposes of this invention, we do not differentiate between the chips or board that drives a peripheral and the peripheral itself.

Figure 2:
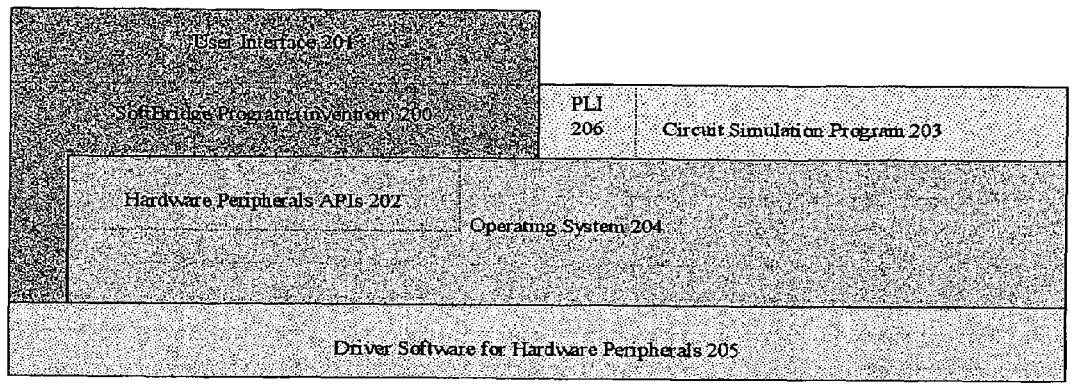
FIG. 2 shows a block diagram of typical computer software including low-level hardware drivers, an operating system, application programs, and a user interface.

FIG. 2 shows a block diagram of the software executing on processor 101. At the lowest level is the driver software for hardware peripherals 205. This software, usually supplied by the manufacturer of said peripherals allows computer operating system software 204 to access said peripherals without detailed knowledge of the hardware design or the operation of said peripherals. Said operating system also includes routines called hardware peripheral application program interfaces (APIs) 202 that allow application programs to indirectly access the hardware peripherals via said operating system. In this way, application programs can control the peripherals but the operating system can override said control or can allocate these peripherals to application programs according to particular priorities.

A circuit simulation program 203 runs at a higher level than the operating system and uses the operating system to communicate with the user to display information via a peripheral such as a monitor or a printer. Said simulation program also uses the operating system to get information from a user via the mouse or keyboard. The operating system 204 also allows said simulation 203 and other applications to be running simultaneously and allocates time and resources to all applications according to set priorities.

One embodiment of the invention is shown as SoftBridge program 200, an application program that runs on top of the operating system, which controls the computer resources allocated to it. The SoftBridge program 200 can communicate to the simulation 203 via a software interface called a programming language interface (PLI) 206.

Note that the SoftBridge program 200 can use the hardware peripheral APIs 202 to access the hardware peripherals indirectly. In some cases, to increase performance for example, it may be necessary for the SoftBridge program 200 to access the driver software 205 directly, bypassing the operating system 204 and the APIs provided by the operating system.

The user interface 201 is the part of the SoftBridge program 200 that allows the human user to enter information and control operation of the program 200. Said user interface 201 also gives results back to the human user.

In prior art, a circuit simulation of a device that drives a hardware peripheral would output raw data. An engineer would then look over the data and compare it manually to a specification for said hardware peripheral to determine whether the data is correct. This manual checking of data is a time consuming operation that is prone to human error and limits the amount of simulation that can be run because time in the development process must be allocated for humans to check the results. Another prior art method is to create a circuit simulation of the hardware peripheral ("simulated peripheral") and have the simulated device drive the simulated peripheral and observe that the correct behavior occurs. This method requires that an engineer write a model for said hardware peripheral. Not only does this take time to develop said model, but the model itself is prone to human error because it may not be completely correct and may thus not accurately model the true behavior of the peripheral hardware. Because the circuit simulation software must now simulate not only the device that drives the software but also the peripheral hardware device being driven, the simulation software runs much slower.

In prior art, a simulated device that receives data from a hardware peripheral would need to have raw data written by an engineer and then used by the simulation software as stimuli for the device. This manual creation of data is a time consuming operation that is prone to human error and limits the amount of simulation that can be run because time in the development process must be allocated for humans to create the data. Another prior art method is to create a circuit simulation of the hardware peripheral and have the simulated peripheral drive the simulated device and observe that the behavior is correct. This method requires that an engineer write a model for the hardware peripheral. Not only does this take time to develop said model, but the model itself is prone to human error because it may not be completely correct and may thus not accurately model the true behavior of the peripheral hardware. Because the circuit simulation software must now simulate not only the device that drives the software but also the peripheral hardware device being driven, the simulation software runs much slower.

In other prior art, a hardware peripheral device is connected, pin by pin, to another hardware peripheral device called a hardware modeler interface, which is in turn connected to a host computer. Said host computer runs a circuit simulation of a device. Whenever said simulated device intends to stimulate said hardware peripheral, said simulation software notifies special hardware modeling software, which forces said hardware modeler interface to assert or deassert signals to said hardware peripheral according to the simulated device outputs. Similarly, whenever said hardware peripheral outputs change, said signals are sent to said hardware modeler interface, which notifies said hardware modeling software, which in turn notifies said simulation software, which stimulates said simulated device. This method requires very specialized software, the hardware modeling software, to interface between the simulation software and the hardware modeler interface. This hardware modeling software must continually be rewritten to be compatible with new operating systems, new host computers, or new simulation software. The hardware modeler interface is a costly, specialized piece of hardware that must physically be connected to the hardware peripheral. Said hardware modeler interface is limited to connecting to certain hardware peripheral devices by the type and size of the connectors that it has available. For example, to connect to an ISA card, said hardware modeler interface must have an ISA connector and to connect to a PCI card, said hardware modeler interface must have a PCI connector. To be able to connect to any kind of peripheral device would require said hardware modeler interface to comprise an extremely large circuit board with dozens of connectors, or consist of dozens of different boards for connecting to different peripheral hardware devices.

Figure 3:
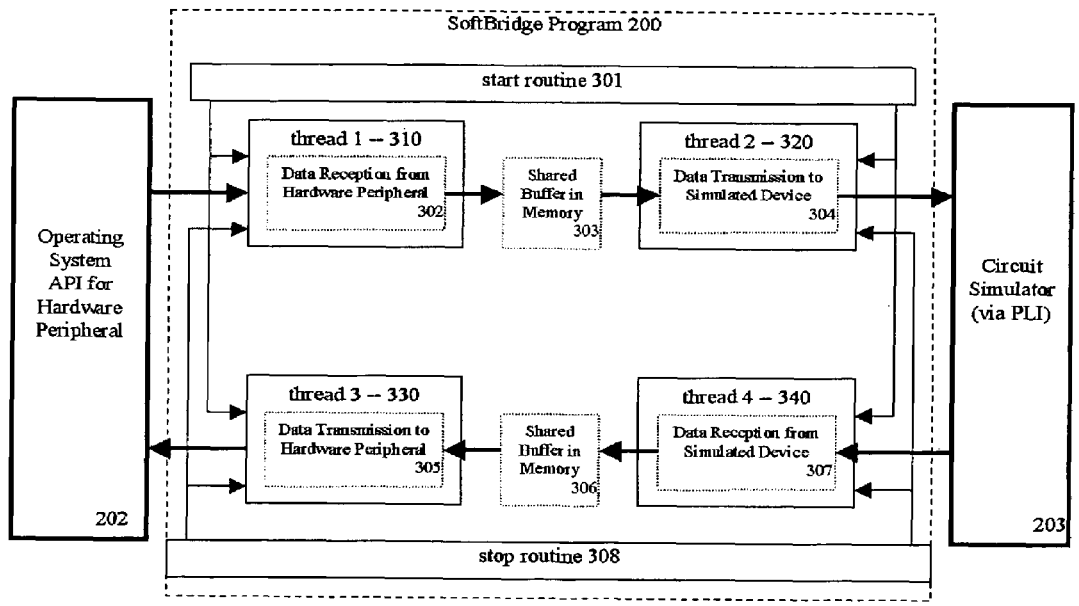
FIG. 3 is a block diagram showing the functions performed by SoftBridge program 200, in accordance with one embodiment of the present invention.

The present invention overcomes the limitations of the prior art by interfacing a real hardware peripheral to the circuit simulation of said device, taking advantage of standard software that is easily available and has already been fully tested. This standard software includes driver software and APIs that are written by the hardware peripheral manufacturer and are included in most standard operating systems. As shown in FIG. 3, data from the circuit simulation 203 of said device that is intended to drive said hardware peripheral is sent to the SoftBridge program 200 from the circuit simulation program PLI. The SoftBridge program 200 sends said data to the hardware peripheral either via the hardware peripheral API 202 of the operating system or directly to the hardware peripheral device drivers 205. Data from the hardware peripherals is retrieved by the SoftBridge program 200 either from the hardware peripheral API 202 of the operating system or directly from the hardware peripheral device drivers 205. The SoftBridge program 200 sends said data to the circuit simulation 203 via the circuit simulation program PLI.

FIG. 3 shows a block diagram of the SoftBridge program. In this embodiment, the SoftBridge program 200 has a start routine 301 that initiates the program and begins execution upon input from the user. Said start routine initializes four independent threads that run simultaneously, thread 1 (310), thread 2 (320), thread 3 (330), and thread 4 (340). Thread 1 consists of a data reception routine 302 that receives data from the hardware peripheral either via the operating system API 202 or directly from the hardware drivers. Said data reception routine 302 may obtain said data by polling the hardware or alternatively via an interrupt mechanism that signals the thread whenever data is available from said hardware. Said data reception software routine 302 receives said data and stores it in a shared memory buffer 303. Thread 2 consists of data transmission routine 304 that polls said shared buffer 303. When data is available in said shared buffer 303, said data transmission routine 304 retrieves said data. If necessary, data transmission routine 304 modifies said data to be acceptable to the circuit simulator 203. Data transmission routine 304 then transmits said data to said circuit simulator via a PLI.

Thread 4 consists of a data reception routine 307 that retrieves data from circuit simulator 203 via a PLI. Thread 4 may obtain said data by polling the circuit simulator or alternatively via an interrupt mechanism that signals the thread whenever data is available from said circuit simulator. Said data reception routine 307 stores said received data in shared memory buffer 306. Thread 3 consists of data transmission routine 305 that polls said shared buffer 306. When data is available in said shared buffer 306, said data reception routine 305 retrieves said data. If necessary, said data reception routine 305 modifies said data to be acceptable to the hardware peripheral. Said data reception routine 305 then transmits said data to said hardware peripheral either via the operating system API 202 or directly to the hardware drivers.

In this embodiment, the SoftBridge program 200 has a stop routine 308 that takes input from the user in order to stop all executing threads of the program.

Figure 4:
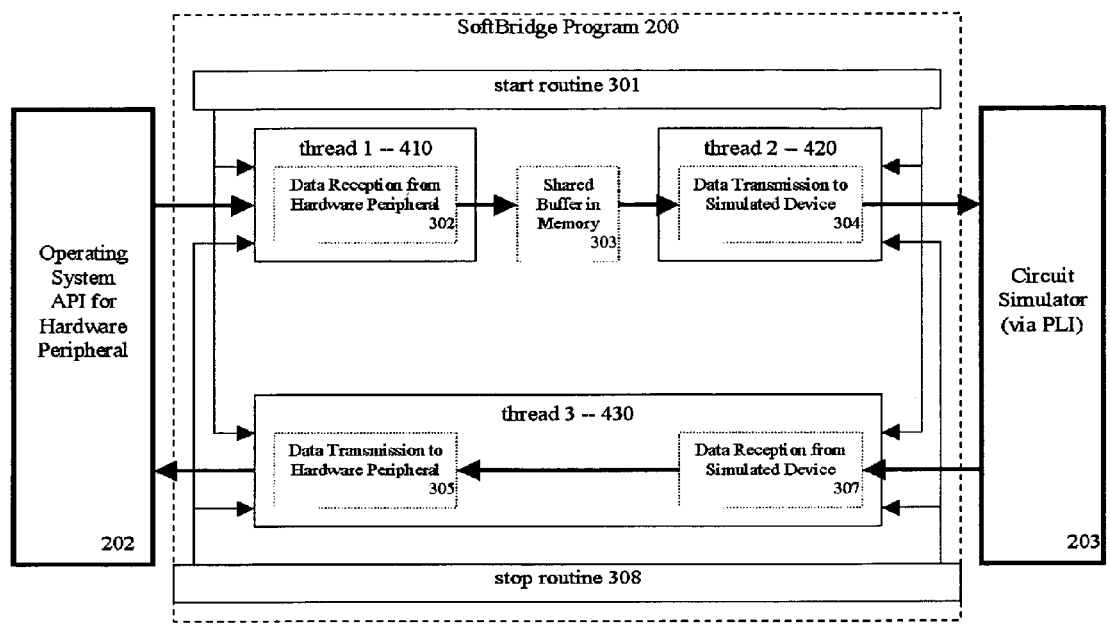
FIG. 4 is a block diagram showing the functions performed by SoftBridge program 200, in accordance with a second embodiment of the present invention.

FIG. 4 shows another embodiment of the SoftBridge program 200. In this embodiment, the SoftBridge program 200 has a start routine 301 that initiates the program and begins execution upon input from the user. Said start routine initializes three independent threads that run simultaneously, thread 1 (410), thread 2 (420), and thread 3 (430). Thread 1 consists of a data reception routine 302 that receives data from the hardware peripheral either via the operating system API 202 or directly from the hardware drivers. Said data reception routine 302 may obtain said data by polling the hardware or alternatively via an interrupt mechanism that signals the thread whenever data is available from said hardware. Said data reception software routine 302 receives said data and stores it in a shared memory buffer 303. Thread 2 consists of data transmission routine 304 that polls said shared buffer 303. When data is available in said shared buffer 303, said data transmission routine 304 retrieves said data. If necessary, data transmission routine 304 modifies said data to be acceptable to the circuit simulator 203. Data transmission routine 304 then transmits said data to said circuit simulator via a PLI.

Thread 3 consists of a data reception routine 307 that retrieves data from circuit simulator 203 via a PLI and a data transmission routine 305 that transmits said data to the hardware peripheral either via the operating system API 202 or directly to the hardware drivers. Thread 3 may obtain said data by polling the circuit simulator or alternatively via an interrupt mechanism that signals the thread whenever data is available from said circuit simulator. Said data reception routine 307 sends said received data to said data reception routine 305 that modifies said data to be acceptable to the hardware peripheral, if necessary, then transmits said data to said hardware peripheral either via the operating system API 202 or directly to the hardware drivers. This embodiment takes advantage of the fact that the circuit simulator 203 is running much slower than the software of the SoftBridge program 200 and that the hardware peripheral can receive data at a faster rate than the software can send it. Therefore there is only a single thread to retrieve data from the circuit simulator and send it to the hardware peripheral. In this embodiment, the SoftBridge program 200 can perform the entire operation of thread 3 without slowing down the circuit simulator or the hardware peripheral. Unlike the embodiment shown in FIG. 3, this embodiment does not need a shared memory buffer between data reception routine 307 and data transmission routine 305.

In this embodiment, the SoftBridge program 200 has a stop routine 308 that takes input from the user in order to stop all executing threads of the program.

Figure 5:
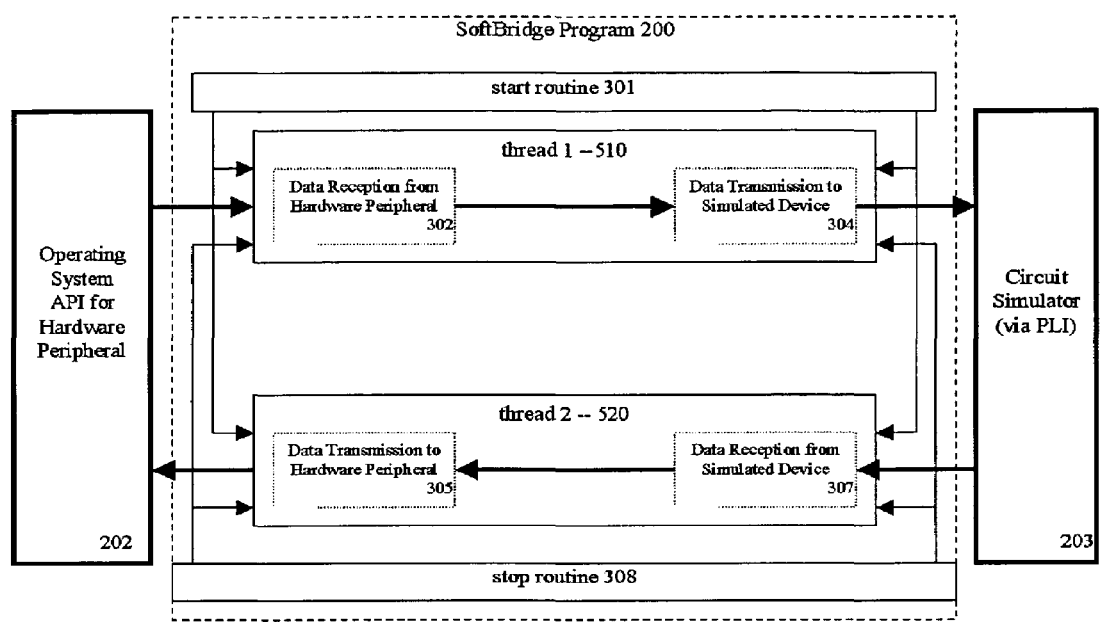
FIG. 5 is a block diagram showing the functions performed by SoftBridge program 200, in accordance with a third embodiment of the present invention.

FIG. 5 shows another embodiment of the SoftBridge program 200. In this embodiment, the SoftBridge program 200 has a start routine 301 that initiates the program and begins execution upon input from the user. Said start routine initializes two independent threads that run simultaneously, thread 1 (510), and thread 2 (520). Thread 1 consists of a data reception routine 302 and a data transmission routine 304. Data reception routine 302 receives data from the hardware peripheral either via the operating system API 202 or directly from the hardware drivers. Said data reception routine 302 may obtain said data by polling the hardware or alternatively via an interrupt mechanism that signals the thread whenever data is available from said hardware. Said data reception software routine 302 receives said data and sends it to said data transmission routine 304 that modifies said data to be acceptable to the circuit simulator 203, if necessary, then transmits it to said circuit simulator via a PLI. This embodiment takes advantage of the fact that the hardware peripheral sends data at a slower rate than the software of the SoftBridge program 200 can receive it. Therefore, there is only a single thread to retrieve data from the hardware peripheral and send it to the circuit simulator. In this embodiment, the SoftBridge program 200 can perform the entire operation of thread 1 without missing data from the hardware peripheral. Unlike the embodiment shown in FIG. 4, this embodiment does not need a shared memory buffer between data reception routine 302 and data transmission routine 304.

Thread 2 consists of a data reception routine 307 that retrieves data from circuit simulator 203 via a PLI and a data transmission routine 305 that transmits said data to the hardware peripheral either via the operating system API 202 or directly to the hardware drivers. Thread 2 may obtain said data by polling the circuit simulator or alternatively via an interrupt mechanism that signals the thread whenever data is available from said circuit simulator. Said data reception routine 307 sends said received data to said data reception routine 305 that modifies said data in order to be acceptable to the hardware peripheral, if necessary, then transmits said data to said hardware peripheral either via the operating system API 202 or directly to the hardware drivers.

In this embodiment, the SoftBridge program 200 has a stop routine 308 that takes input from the user in order to stop all executing threads of the program.

Various modifications and adaptations of the operations described here would be apparent to those skilled in the art based on the above disclosure. Many variations and modifications within the scope of the present SoftBridge program 200 are therefore possible. The present SoftBridge program 200 is set forth by the following claims.

I claim:

1. A method for communicating data between a simulation of an electronic device carried out by a program executing in a host computer and a hardware peripheral device attached to said host computer, said hardware peripheral device operating at a higher speed than said simulation, the method comprising:
   receiving data from said hardware peripheral device using peripheral device interface software running on said computer;
   transmitting said data received from said hardware peripheral device to said simulation through a programming language interface;
   receiving data from said simulation through said programming language interface; and
   transmitting said received data from said simulation to said hardware peripheral device using peripheral device interface software running on said host computer;
   wherein said receiving data from said hardware peripheral device is executed in a first thread, said transmitting said data received from said hardware peripheral device is executed in a second thread, said receiving data from said simulation is executed in a third thread, and said transmitting said data received from said simulation is executed in a fourth thread.

2. The method of claim 1, further comprising storing said received data from said hardware peripheral device in a first buffer in memory.

3. The method of claim 1, further comprising storing said received data from said simulation in a second buffer in memory.

4. The method of claim 2, further comprising changing the size of said first buffer at run time.

5. The method of claim 3, further comprising changing the size of said second buffer at run time.

6. The method of claim 1, further comprising keeping a record of said data received from said hardware peripheral device, said data transmitted to said simulation, said data received from said simulation, and said data transmitted to said hardware peripheral device.

7. The method of claim 1, further comprising recording the throughput of said data.

8. The method of claim 1, further comprising modifying said received data from said hardware peripheral device to make said data suitable for transmission to said simulation.

9. The method of claim 1, further comprising modifying said received data from said simulation to make said data suitable for transmission to said hardware peripheral device.

10. A method for communicating data between a simulation of an electronic device carried out by a program executing on a host computer and a hardware peripheral device attached to said host computer, said hardware peripheral device running at a higher speed than said simulation, the method comprising:
   receiving data from said hardware peripheral device using peripheral device interface software running on said computer;
   storing said data received from said hardware peripheral device in a first buffer;
   retrieving said data stored in said first buffer;
   modifying said retrieved data to make said data suitable for transmission to said simulation;

transmitting said data received from said hardware peripheral to said simulation through a programming language interface;
receiving data from said simulation through said programming language interface;
storing said data received from said simulation in a second buffer;
retrieving said data stored in said second buffer;
modifying said retrieved data to make said data suitable for transmission to said hardware peripheral device; and
transmitting said received data from said simulation to said hardware peripheral device using peripheral device interface software running on said host computer;
wherein said receiving data from said hardware peripheral device is executed in a first thread, said transmitting said data received from said hardware peripheral device is executed in a second thread, said receiving data from said simulation is executed in a third thread, and said transmitting said data received from said simulation is executed in a fourth thread.

11. An apparatus for communicating data between a simulation of an electronic device carried out by a program executing in a host computer and a hardware peripheral device attached to said host computer, said hardware peripheral device running at a higher speed than said simulation, the apparatus comprising:
a memory;
computer instructions executable by said host computer for:
receiving data from said hardware peripheral device;
transmitting said data received from said hardware peripheral device to said electronic circuit simulation;
receiving data from said electronic circuit simulation; and
transmitting said data received from said electronic circuit simulation to said hardware peripheral device;
wherein said receiving data from said hardware peripheral device is executed in a first thread, said transmitting said data received from said hardware peripheral device is executed in a second thread, said receiving data from said simulation is executed in a third thread, and said transmitting said data received from said simulation is executed in a fourth thread.

12. The apparatus of claim 11, further comprising:
a buffer in said memory; and
computer instructions executable by the computer for storing data received from said hardware peripheral device in said buffer.

13. The apparatus of claim 12, further comprising computer instructions executable by the computer for changing the size of said first buffer at run time.

14. The apparatus of claim 11 further comprising:
a buffer in said memory; and
computer instructions executable by the computer for storing data received from said electronic circuit simulation in said buffer.

15. The apparatus of claim 14, further comprising computer instructions executable by the computer for changing the size of said second buffer at run time.

16. The apparatus of claim 11, further comprising computer instructions executable by the computer for modifying said received data from said simulation to make said data suitable for transmission to said hardware peripheral device.

17. The apparatus of claim 11, further comprising computer instructions executable by the computer for modifying said received data from said hardware peripheral device to make said data suitable for transmission to said simulation.

18. The apparatus of claim 11, further comprising computer instructions executable by the computer for keeping a record of said data received from said hardware peripheral, said data transmitted to said simulation, said data received from said simulation, and said data transmitted to said hardware peripheral device.

19. The apparatus of claim 11, further comprising computer instructions executable by the computer for recording the throughput of said data.

20. An apparatus for communicating data between a simulation of an electronic device carried out by a program executing in a host computer and a hardware peripheral device attached to said host computer, said hardware peripheral device running at a higher speed than said simulation, the apparatus comprising:
a. a computer having a memory;
b. computer instructions executable by said host computer for:
receiving data from said hardware peripheral device using software running on said computer;
storing said data received from said hardware peripheral device in a first buffer in memory;
retrieving said data stored in said first buffer;
modifying said retrieved data to make said data suitable for transmission to said simulation;
transmitting said data received from said hardware peripheral device to said simulation through a programming language interface;
receiving data from said simulation through said programming language interface;
storing said data received from said simulation in a second buffer in memory;
retrieving said data stored in said second buffer;
modifying said retrieved data to make said data suitable for transmission to said hardware peripheral device; and
transmitting said received data from said simulation to said hardware peripheral device using software running on said host computer;
wherein said receiving data from said hardware peripheral device is executed in a first thread, said transmitting said data received from said hardware peripheral device is executed in a second thread, said receiving data from said simulation is executed in a third thread, and said transmitting said data received from said simulation is executed in a fourth thread.

21. A computer readable medium having computer instructions executable in a host computer for communicating data between a simulation of an electronic device carried out in a program executing in said host computer and a hardware peripheral device attached to said host computer, said hardware peripheral device running at a higher speed than said simulation, the instructions performing:
receiving data from said hardware peripheral device;
transmitting said data received from said hardware peripheral to said electronic circuit simulation;
receiving data from said electronic circuit simulation; and
transmitting said data received from said electronic circuit simulation to said hardware peripheral device;
wherein said receiving data from said hardware peripheral device is executed in a first thread, said transmitting said data received from said hardware peripheral device is executed in a second thread, said receiving data from said simulation is executed in a third thread, and said transmitting said data received from said simulation is executed in a fourth thread.

22. The computer readable medium of claim 21, further comprising computer instructions for storing data received from said hardware peripheral device in a first buffer.

23. The computer readable medium of claim 22, further comprising computer instructions for changing the size of said first buffer at run time.

24. The computer readable medium of claim 21, further comprising computer instructions for storing data received from said electronic circuit simulation in a second buffer.

25. The computer readable medium of claim 24, further comprising computer instructions for changing the size of said second buffer at run time.

26. The computer readable medium of claim 21, further comprising computer instructions for modifying said received data from said simulation to make said data suitable for transmission to said hardware peripheral device.

27. The computer readable medium of claim 21, further comprising computer instructions for modifying said received data from said hardware peripheral device to make said data suitable for transmission to said simulation.

28. The computer readable medium of claim 21, further comprising computer instructions for keeping a record of said data received from said hardware peripheral device, said data transmitted to said simulation, said data received from said simulation, and said data transmitted to said hardware peripheral device.

29. The computer readable medium of claim 21, further comprising computer instructions for recording the throughput of said data.

30. A computer readable medium having computer instructions for communicating data between a simulation of an electronic device carried out by a program executing in a host computer and a hardware peripheral device attached to said host computer, said hardware peripheral device running at a higher speed than said simulation, the instructions performing:
 receiving data from said hardware peripheral device using peripheral device interface software running on said computer;
 storing said data received from said hardware peripheral in a first buffer in memory;
 retrieving said data stored in said first buffer;
 modifying said retrieved data to make said data suitable for transmission to said simulation;
 transmitting said data received from said hardware peripheral device to said simulation through a programming language interface;
 receiving data from said simulation through said programming language interface;
 storing said data received from said simulation in a second buffer in memory;
 retrieving said data stored in said second buffer;
 modifying said retrieved data to make said data suitable for transmission to said hardware peripheral device; and
 transmitting said received data from said simulation to said hardware peripheral device using peripheral device interface software running on said host computer;
 wherein said receiving data from said hardware peripheral device is executed in a first thread, said transmitting said data received from said hardware peripheral device is executed in a second thread, said receiving data from said simulation is executed in a third thread, and said transmitting said data received from said simulation is executed in a fourth thread.

31. A method for communicating data between a simulation of an electronic device carried out by a program executing in a host computer and a hardware peripheral device attached to said host computer, said hardware peripheral device operating at a higher speed than said simulation, the method comprising:
 receiving data from said hardware peripheral device using peripheral device interface software running on said computer;
 transmitting said data received from said hardware peripheral device to said simulation through a programming language interface;
 receiving data from said simulation through said programming language interface; and
 transmitting said received data from said simulation to said hardware peripheral device using peripheral device interface software running on said host computer;
 wherein said receiving data from said hardware peripheral device is executed in a first thread, said transmitting said data received from said hardware peripheral device is executed in a second thread, said receiving data from said simulation and said transmitting said data received from said simulation are executed in a third thread.

32. The method of claim 31, further comprising storing said received data from said hardware peripheral device in a first buffer in memory.

33. The method of claim 31, further comprising storing said received data from said simulation in a second buffer in memory.

34. The method of claim 32, further comprising changing the size of said first buffer at run time.

35. The method of claim 33, further comprising changing the size of said second buffer at run time.

36. The method of claim 31, further comprising keeping a record of said data received from said hardware peripheral device, said data transmitted to said simulation, said data received from said simulation, and said data transmitted to said hardware peripheral device.

37. The method of claim 31, further comprising recording the throughput of said data.

38. The method of claim 31, further comprising modifying said received data from said hardware peripheral device to make said data suitable for transmission to said simulation.

39. The method of claim 31, further comprising modifying said received data from said simulation to make said data suitable for transmission to said hardware peripheral device.

40. An apparatus for communicating data between a simulation of an electronic device carried out by a program executing in a host computer and a hardware peripheral device attached to said host computer, said hardware peripheral device running at a higher speed than said simulation, the apparatus comprising:
 a. a memory;
 b. computer instructions executable by said host computer for:
  receiving data from said hardware peripheral device;
  transmitting said data received from said hardware peripheral device to said electronic circuit simulation;
  receiving data from said electronic circuit simulation; and transmitting said data received from said electronic circuit simulation to said hardware peripheral device;

wherein said receiving data from said hardware peripheral device is executed in a first thread, said transmitting said data received from said hardware peripheral device is executed in a second thread, said receiving data from said simulation and said transmitting said data received from said simulation are executed in a third thread.

41. The apparatus of claim 40, further comprising:
a. a buffer in said memory; and
b. computer instructions executable by the computer for storing data received from said hardware peripheral device in said buffer.

42. The apparatus of claim 41, further comprising computer instructions executable by the computer for changing the size of said first buffer at run tune.

43. The apparatus of claim 40 further comprising:
a. a buffer in said memory; and
b. computer instructions executable by the computer for storing data received from said electronic circuit simulation in said buffer.

44. The apparatus of claim 43, further comprising computer instructions executable by the computer for changing the size of said second buffer at run time.

45. The apparatus of claim 40, further comprising computer instructions executable by the computer for modifying said received data from said simulation to make said data suitable for transmission to said hardware peripheral device.

46. The apparatus of claim 40, further comprising computer instructions executable by the computer for modifying said received data from said hardware peripheral device to make said data suitable for transmission to said simulation.

47. The apparatus of claim 40, further comprising computer instructions executable by the computer for keeping a record of said data received from said hardware peripheral, said data transmitted to said simulation, said data received from said simulation, and said data transmitted to said hardware peripheral device.

48. The apparatus of claim 40, further comprising computer instructions executable by the computer for recording the throughput of said data.

49. A computer readable medium having computer instructions executable in a host computer for communicating data between a simulation of an electronic device carried out in a program executing in said host computer and a hardware peripheral device attached to said host computer, said hardware peripheral device running at a higher speed than said simulation, the instructions performing:

receiving data from said hardware peripheral device;
transmitting said data received from said hardware peripheral to said electronic circuit simulation;
receiving data from said electronic circuit simulation; and
transmitting said data received from said electronic circuit simulation to said hardware peripheral device;
wherein said receiving data from said hardware peripheral device is executed in a first thread, said transmitting said data received from said hardware peripheral device is executed in a second thread, said receiving data from said simulation and said transmitting said data received from said simulation are executed in a third thread.

50. The computer readable medium of claim 49, further comprising computer instructions for storing data received from said hardware peripheral device in a first buffer.

51. The computer readable medium of claim 50, further comprising computer instructions for changing the size of said first buffer at run time.

52. The computer readable medium of claim 49, further comprising computer instructions for storing data received from said electronic circuit simulation in a second buffer.

53. The computer readable medium of claim 52, further comprising computer instructions for changing the size of said second buffer at run time.

54. The computer readable medium of claim 49, further comprising computer instructions for modifying said received data from said simulation to make said data suitable for transmission to said hardware peripheral device.

55. The computer readable medium of claim 49, further comprising computer instructions for modifying said received data from said hardware peripheral device to make said data suitable for transmission to said simulation.

56. The computer readable medium of claim 49, further comprising computer instructions for keeping a record of said data received from said hardware peripheral device, said data transmitted to said simulation, said data received from said simulation, and said data transmitted to said hardware peripheral device.

57. The computer readable medium of claim 49, further comprising computer instructions for recording the throughput of said data.

58. A method for communicating data between a simulation of an electronic device carried out by a program executing on a host computer and a hardware peripheral device attached to said host computer, said hardware peripheral device running at a higher speed than said simulation, the method comprising:

receiving data from said hardware peripheral device using peripheral device interface software running on said computer;
storing said data received from said hardware peripheral device in a first buffer;
retrieving said data stored in said first buffer;
modifying said retrieved data to make said data suitable for transmission to said simulation;
transmitting said data received from said hardware peripheral to said simulation through a programming language interface;
receiving data from said simulation through said programming language interface;
storing said data received from said simulation in a second buffer;
retrieving said data stored in said second buffer;
modifying said retrieved data to make said data suitable for transmission to said hardware peripheral device; and
transmitting said received data from said simulation to said hardware peripheral device using peripheral device interface software running on said host computer;
wherein said receiving data from said hardware peripheral device is executed in a first thread, said transmitting said data received from said hardware peripheral device is executed in a second thread, said receiving data from said simulation and said transmitting said data received from said simulation are executed in a third thread.

59. An apparatus for communicating data between a simulation of an electronic device carried out by a program executing in a host computer and a hardware peripheral device attached to said host computer, said hardware peripheral device running at a higher speed than said simulation, the apparatus comprising:
a. a computer having a memory; and
b. computer instructions executable by said host computer for:

receiving data from said hardware peripheral device using software running on said computer;

storing said data received from said hardware peripheral device in a first buffer in memory;

retrieving said data stored in said first buffer;

modifying said retrieved data to make said data suitable for transmission to said simulation;

transmitting said data received from said hardware peripheral device to said simulation through a programming language interface;

receiving data from said simulation through said programming language interface;

storing said data received from said simulation in a second buffer in memory;

retrieving said data stored in said second buffer;

modifying said retrieved data to make said data suitable for transmission to said hardware peripheral device; and transmitting said received data from said simulation to said hardware peripheral device using software running on said host computer;

wherein said receiving data from said hardware peripheral device is executed in a first thread, said transmitting said data received from said hardware peripheral device is executed in a second thread, said receiving data from said simulation and said transmitting said data received from said simulation are executed in a third thread.

60. A computer readable medium having computer instructions for communicating data between a simulation of an electronic device carried out by a program executing in a host computer and a hardware peripheral device attached to said host computer, said hardware peripheral device running at a higher speed than said simulation, the instructions performing:

receiving data from said hardware peripheral device using peripheral device interface software running on said computer;

storing said data received from said hardware peripheral in a first buffer in memory;

retrieving said data stored in said first buffer;

modifying said retrieved data to make said data suitable for transmission to said simulation;

transmitting said data received from said hardware peripheral device to said simulation through a programming language interface;

receiving data from said simulation through said programming language interface;

storing said data received from said simulation in a second buffer in memory;

retrieving said data stored in said second buffer;

modifying said retrieved data to make said data suitable for transmission to said hardware peripheral device; and transmitting said received data from said simulation to said hardware peripheral device using peripheral device interface software running on said host computer;

wherein said receiving data from said hardware peripheral device is executed in a first thread, said transmitting said data received from said hardware peripheral device is executed in a second thread, said receiving data from said simulation and said transmitting said data received from said simulation are executed in a third thread.

* * * * *